(12) United States Patent
Tam et al.

(10) Patent No.: US 6,548,316 B1
(45) Date of Patent: Apr. 15, 2003

(54) MONOLITHIC SEMICONDUCTOR DEVICE AND METHOD OF MANUFACTURING THE SAME

(75) Inventors: Simon Tam, Cambridge (GB); Piero Migliorato, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/744,479
(22) PCT Filed: May 26, 2000
(86) PCT No.: PCT/GB00/02035
§ 371 (c)(1), (2), (4) Date: Feb. 21, 2001
(87) PCT Pub. No.: WO00/74148
PCT Pub. Date: Dec. 7, 2000

(30) Foreign Application Priority Data
May 27, 1999 (GB) .............................................. 9912447

(51) Int. Cl.⁷ .............................................. H01L 21/00
(52) U.S. Cl. .......................................... 438/22; 438/69
(58) Field of Search .............................. 438/22, 25, 30, 438/48, 51, 55, 60, 64, 69, 75, 105, 106, 144

(56) References Cited

U.S. PATENT DOCUMENTS

| | | | |
|---|---|---|---|
| 4,695,717 A | | 9/1987 | Hirai et al. .................. 250/213 |
| 5,003,221 A | * | 3/1991 | Shimizu ...................... 313/509 |
| 5,546,413 A | | 8/1996 | Lebby et al. .................. 372/6 |
| 5,559,400 A | * | 9/1996 | Nakayama et al. .......... 313/506 |
| 5,969,475 A | * | 10/1999 | Friend et al. ................ 313/506 |

FOREIGN PATENT DOCUMENTS

| | | |
|---|---|---|
| EP | 0 304 939 A2 | 3/1989 |
| EP | 0 466 116 A2 | 1/1992 |
| EP | 0 734 078 A2 | 9/1996 |
| EP | 0 878 883 A1 | 11/1998 |
| JP | A 61-44483 | 3/1986 |
| JP | A 8-315984 | 11/1996 |

OTHER PUBLICATIONS

Stearns et al., "Two–dimensional amorphous–silicon photoconductor array for optical imaging", Applied Optics, vol. 31, No. 32, Nov. 10, 1992.
Stearns, "Neural network that incorporates direct optical imaging", Applied Optics, vol. 34, No. 14, May 10, 1995.

* cited by examiner

Primary Examiner—David Nelms
Assistant Examiner—David Nhu
(74) Attorney, Agent, or Firm—Oliff & Berridge, PLC

(57) ABSTRACT

A monolithic semiconductor device comprising a substrate, a layer of photoconductive material formed on the substrate, a transparent insulator formed on the photoconductive material and a layer of material which emits light when electrically stimulated, said layer of light emitting material being formed on the transparent insulator. The light emitting material is preferably an organic electro-luminescent material such as a polymer. Particular application of the device is in implementing an analog based neural network and by selection and arrangement of various components the device may also act as a display. A method of manufacturing the device is also disclosed.

17 Claims, 3 Drawing Sheets

MONOLITHIC SEMICONDUCTOR DEVICE AND METHOD OF MANUFACTURING THE SAME

BACKGROUND OF THE INVENTION

The present invention relates to a monolithic semiconductor device and method of manufacturing the same. Herein the term monolithic means that the device has a single substrate.

SUMMARY OF THE INVENTION

According to one aspect of the present invention there is provided a monolithic semiconductor device comprising a substrate, a layer of photoconductive material formed on the substrate, a transparent insulator formed on the photoconductive material and a layer of material which emits light when electrically stimulated, said layer of light emitting material being formed on the transparent insulator.

Preferably the light emitting layer is an organic electro-luminescent material such as a light emitting polymer.

Beneficially the device is structured and arranged also to act as a display.

The present invention also provides a neural network comprising a plurality of the semiconductor devices of the invention.

According to another aspect of the present invention there is provided a method of manufacturing a monolithic semiconductor device comprising the steps of providing a substrate, forming a layer of photoconductive material on the substrate, forming a transparent insulator on the photoconductive material, and forming on the transparent insulator a layer of material which emits light when electrically stimulated.

Preferably, the method involves the use of TFT techniques.

Beneficially, the method further comprises the step of formation of a plurality of TFTs on the substrate, said TFTs being respectively connected to the photoconductive and light emitting layers.

BRIEF DESCRIPTION OF THE DRAWINGS

Embodiments of the present invention will now be described by way of example only and with reference to the accompanying drawings, in which.

DETAILED DESCRIPTION OF PREFERRED EMBODIMENTS

Figure 1:
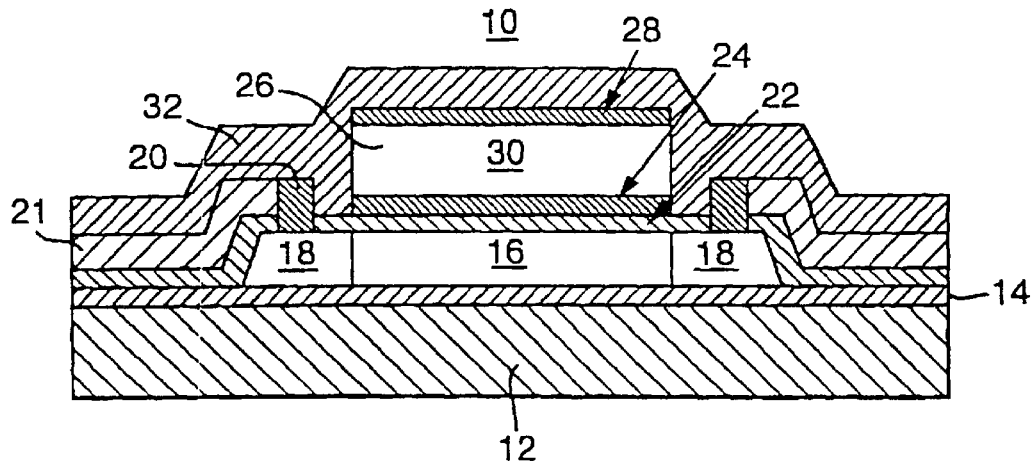
FIG. 1 illustrates a schematic vertical section through a semiconductor device according to one embodiment of the present invention.

One embodiment of a semiconductor device according to the present invention is illustrated in the schematic vertical section of FIG. 1. The main components of the device are the substrate 12, the photoconductive layer 16 and the light emitting element 30. Layers 22 and 24, between the light emitting material 26 and the photoconductive layer 16, are transparent.

In detail, the semiconductor device 10 comprises a substrate 12 having an insulating oxide 14 formed thereon. A layer of amorphous silicon (a-Si) 16 is provided on the oxide 14. A respective $n^+$ region 18 is formed at each end of the a-Si layer. These $n^+$ terminals 18 are contacted by respective metal electrodes 20 which extend through a transparent insulator layer 22 which is formed over the a-Si layer 16. Lead lines 21 connect the electrodes to the exterior of the device. The transparent insulator 22 may be formed of silicon dioxide. A transparent conductor (such as Indium Tin Oxide) 24 is formed on the transparent insulator, in self alignment with the active photoconductor region 16. The ITO conductor 24 forms one electrode of the light emitting element 30. Thus, a light emitting material 26 is provided above the ITO layer 24 and a metal electrode 28 is provided on the opposite side of the light emitting material 26 to the ITO layer 24. The light emitting material is a PPV and electrode 28 may, for example, be formed of Ca or Al. A field oxide 32 covers the entire upper surface of the overall structure.

It will be readily apparent to the person skilled in the art that the structure illustrated in FIG. 1 can be fabricated using conventional semiconductor fabrication techniques employing conventional mask and ion implantation processes. In particular, the device can be fabricated using conventional polysilicon TFT techniques.

It will also be readily apparent that the embodiment illustrated in FIG. 1 could effectively operate as a layered transistor and thus the ITO should be connected to ground in order to achieve the operational effects described herein.

Preferably, the light emitting element 30 is an organic electro-luminescent device (OELD). Organic electro-luminescent devices are sufficiently well known that the active material and operation of the device does not require description herein. Such devices are, of course, current driven devices.

A particular advantage of using an OELD and polysilicon TFT technology to implement the arrangement illustrated in FIG. 1 is that the entire fabrication process can be a low temperature process.

One specific, and non-limiting, application in which the device of FIG. 1 can be used in order to gain significant benefits over previous arrangements will now be described in detail. This application is an electro-optical neural network.

Electro-optical neural networks are known. They provide analog vector-matrix multiplication and are readily suited to parallel processing with short overall system response time when the number of synapses in the network is high. The analog network mimics the human neural system more closely than a digital network and should thus be more capable of analysing abstract ideas than a digital network. However, known electro-optical neural networks suffer from serious limitations which have prevented their wide spread use. Thus, one aspect of the present invention is to provide electro-optical neural network.

Figure 2:
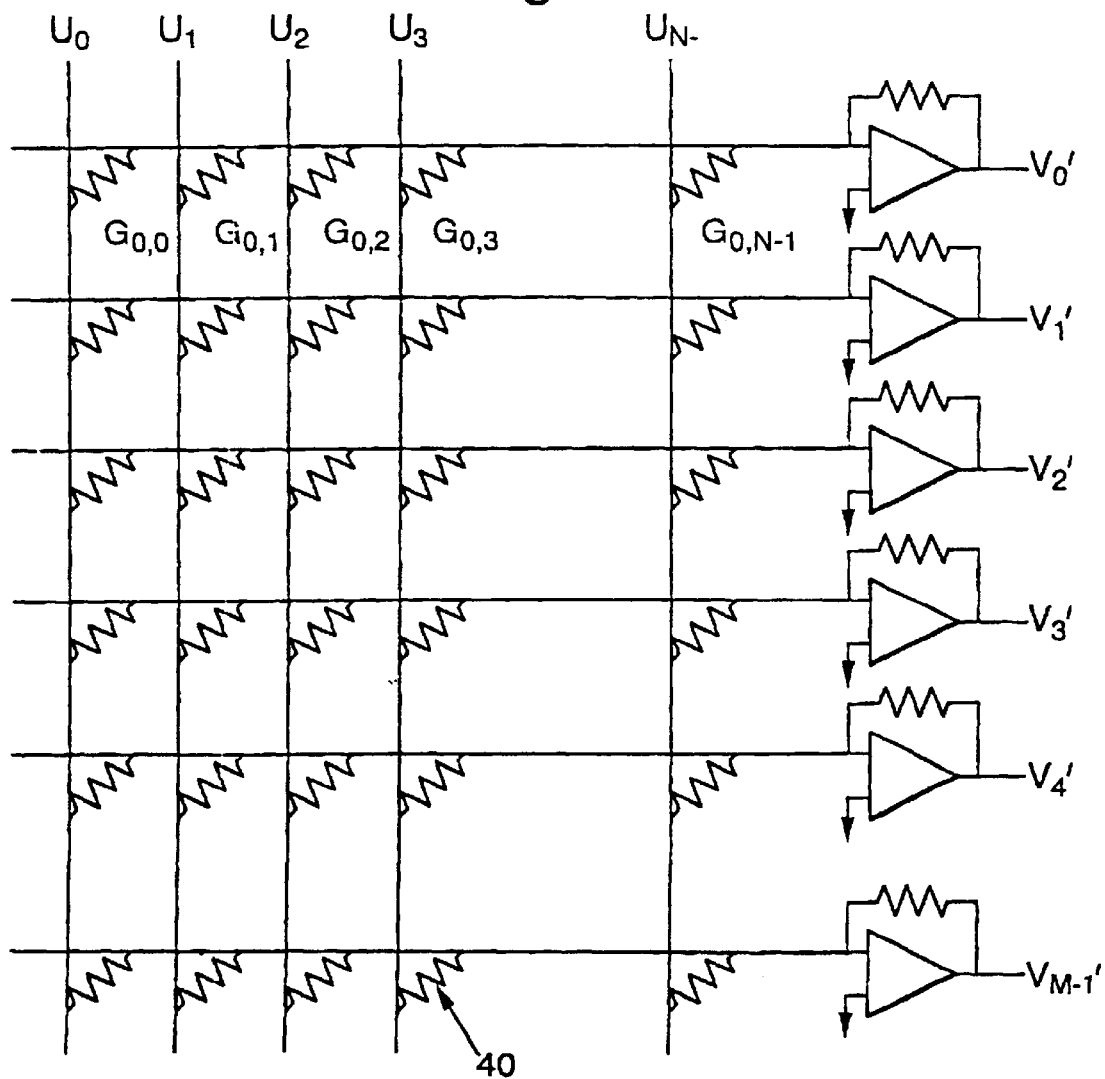
FIG. 2 is a schematic circuit diagram showing implementation of a basic electro-optical analog neural network and analog vector matrix multiplication.

FIG. 2 is a schematic circuit diagram showing implementation of a basic electro-optical analog neural network and analog vector matrix multiplication. The circuit comprises a plurality of photoresistors 40 connected between vertical and horizontal conductors in a matrix. Each photoresistor constitutes a neuron. The total current flowing out of a horizontal conductor is the dot product between the vertical conductors and the conductance values of the horizontal array of photoresistors. Vector matrix multiplication is achieved by applying Ohm's Law and thus the horizontal current is passed to a current-to-voltage converter and then to a discriminator. Using the reference symbols used in FIG. 2, the vector matrix multiplication is expressed by:

$$V'_i = \sum_{j=0}^{N-1} A_i G_{i,j} U_j, \quad \text{for } i = 0 \ldots M-1$$

where A is the gain of the current-to-voltage converter, G is the conductance of the photoconductor, U is the voltage of a vertical conductor, M is the number of horizontal conductors and N is the number of vertical conductors.

It will be readily apparent that an arrangement as shown in FIG. 2 and implemented using discrete photoresistors is bulky and very limited in the number of the number of neurons which can be provided in a practical embodiment.

Figure 3:
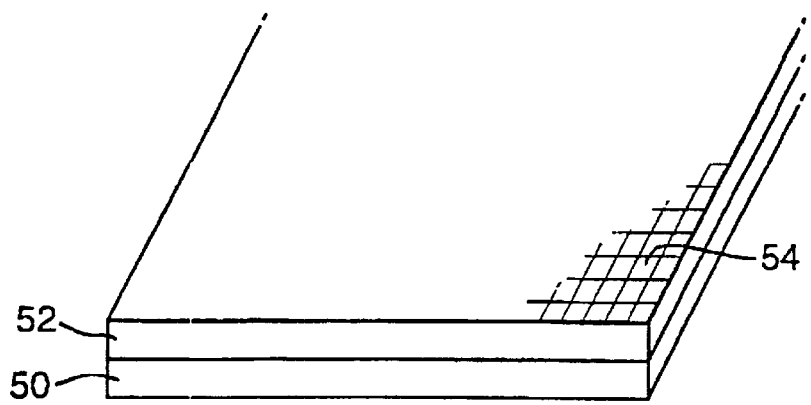
FIG. 3 illustrates a development of the arrangement shown in FIG. 2.

FIG. 3 illustrates a development of the basic arrangement in an attempt to overcome the above mentioned disadvantages thereof. As shown in FIG. 3, a panel 50 of silicon photoconductors is held in registration with a glass panel 52 of liquid crystal (LC) light shutters 54. This construction provides a significant reduction in size over the basic arrangement, even allowing for a plurality of shutters to be provided for each photoconductor. Typically a four by four matrix, i.e. 16, shutters may be provided for each photoconductor. The whole LC panel is illuminated and each shutter has two states, on and off. Thus a total of 17 discrete brightness levels (weightings in the neural network sense) can be differentiated by each photoconductor. In terms of a neural network, this is still somewhat restrictive for practical applications. A further problem arises in that the arrangement shown in FIG. 3 can suffer significant cross-talk problems between neighbouring neurons. These problems are exacerbated by the thickness of the glass panel which necessarily separates the light source from the light sensors. Further, the device complexity is increased by the number of external connections required for the photoconductor panel and the LC panel.

The monolithic semiconductor device of the present invention enables a further improved electro-optical analog neural network to be implemented.

In the application of the device to a neural network, the device illustrated in FIG. 1 constitutes a single neuron and it will be appreciated that a large network of such neurons can be fabricated simultaneously on a single silicon wafer. Thus it will be appreciated that the integration density is readily enhanced. Further, it is immediately apparent from FIG. 1 that cross-talk between neurons is eliminated. Also, the complexity of external connections is substantially reduced compared with the provision of an LC panel and a photoconductor panel. The network implemented with the semiconductor devices of the present invention differs fundamentally from that shown in FIG. 3 in that a respective and independent light source is provided for each photoconductor. A significant enhancement is thus that rather than 17 discrete weightings each neuron in the network according to the present invention can in theory have an infinite number of weightings, as the light source intensity per neuron can be varied continuously and independently.

Figure 4:
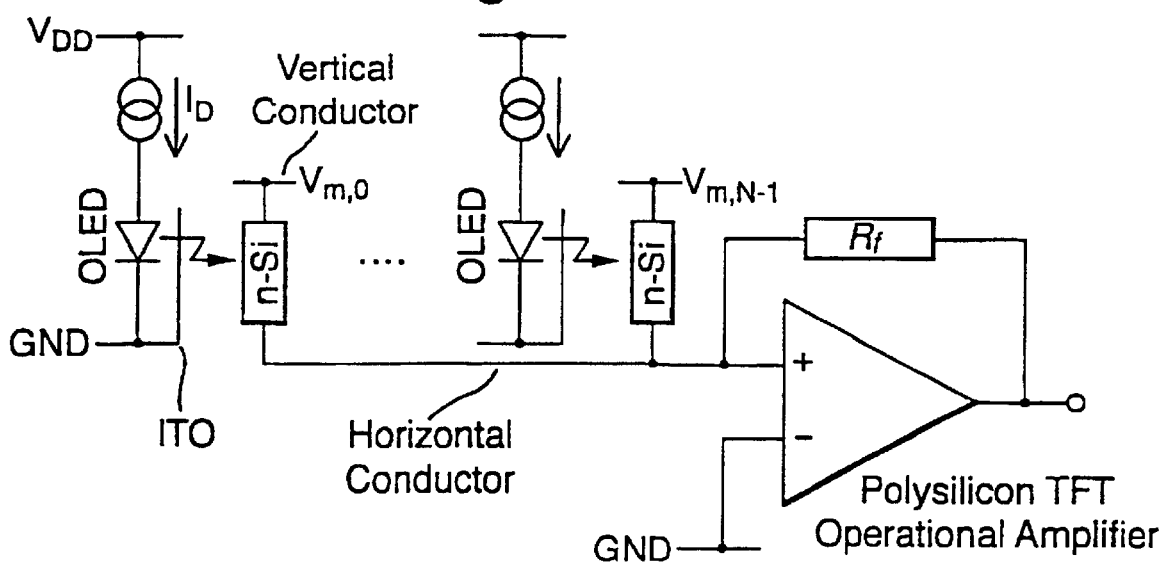
FIG. 4 is a schematic circuit arrangement for a neural network using a plurality of semiconductor devices of the type illustrated in FIG. 1.

A schematic circuit arrangement for a neural network using a plurality of semiconductor devices according to the present invention is shown in FIG. 4. In accordance with the arrangement of FIG. 4, each OELD is driven by a polysilicon TFT current source and current summing from the horizontal conductor is achieved using a polysilicon TFT operational amplifier configured as a current-to-voltage converter. Thus, an entire network can be implemented on a single wafer using conventional TFT technology.

Figure 5:
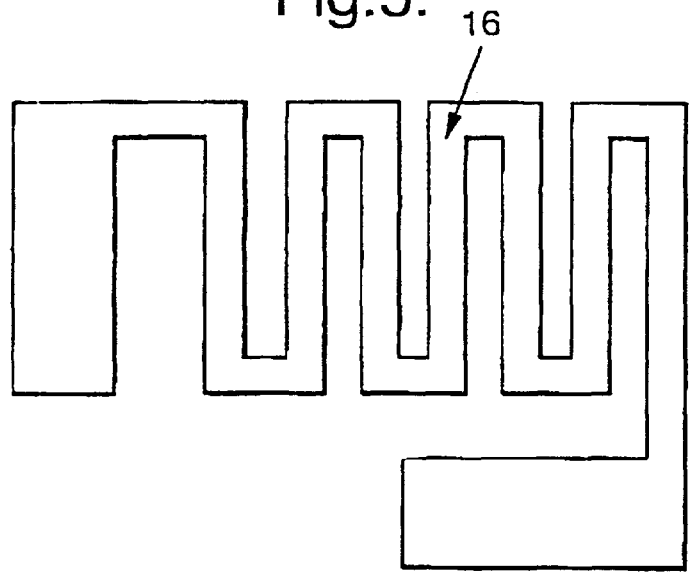
FIG. 5 is an enlarged plan view of the configuration of the a-Si layer to be included in the arrangement shown in FIG. 6.
Figure 6:
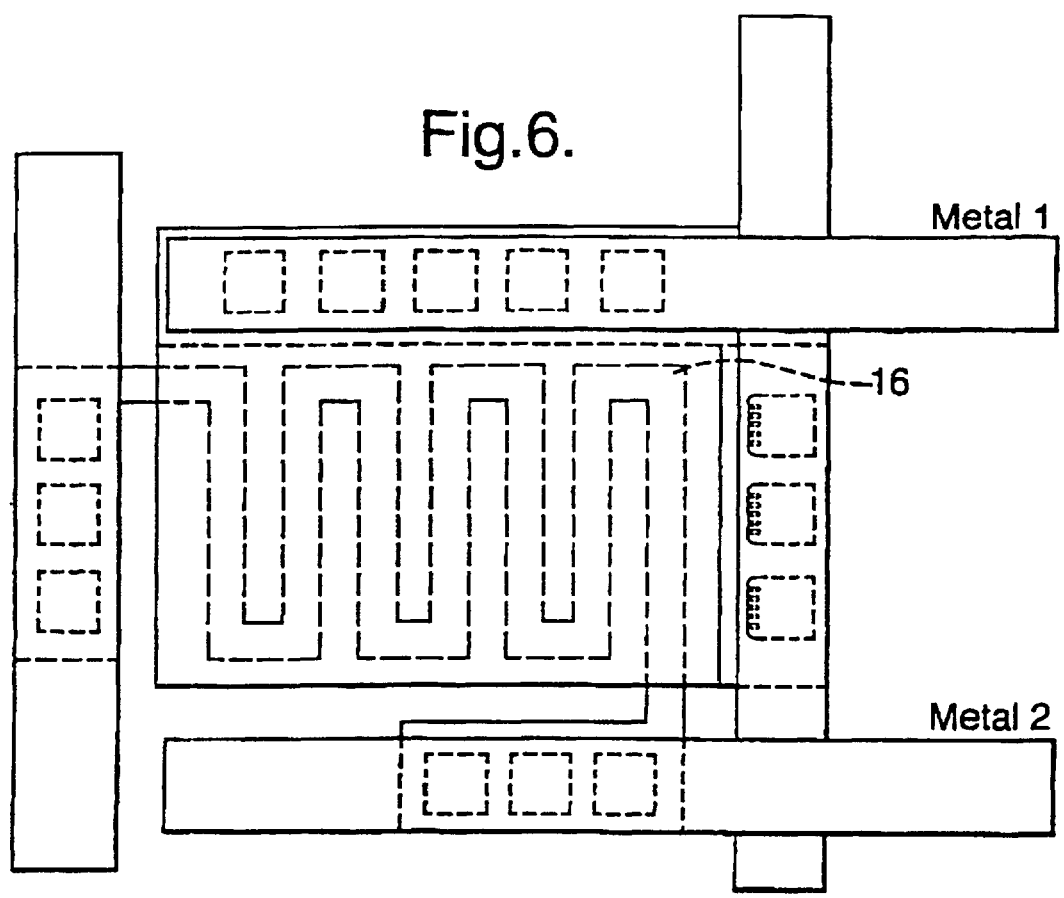
FIG. 6 is a plan view of a neuron and it's synaptic connections in a network according to an embodiment of the present invention.

A plan view of a neuron and it's synaptic connections is shown in FIG. 6. For ease of understanding an enlarged plan view of the configuration of the a-Si layer is shown in FIG. 5. The illustrated configuration of the a-Si layer minimises the contact effect (resistive ratio) so as to enhance the photoconductive property of the layer.

The method of fabricating the arrangement illustrated in FIG. 6, with reference also to FIG. 1, is first to provide the device substrate 12 with an insulating oxide 14 and then to form the photoconducting a-Si pattern (16) of FIG. 5 thereon. Next, the transparent insulator SiO$_2$ layer 22 is formed over the photoconductor 16. Then an OELD is formed by sandwiching a light emitting polymer (LEP) between a layer of cathode material (28) and a layer of ITO (24). This is followed by ion implanting the photoconductor terminals 18. Subsequently, vias are etched and metals 1 and 2 are deposited.

Exceptional utility can be achieved with the device illustrated in FIGS. 1 and 6 by making the substrate and insulating oxide 14 transparent, since the device can then also be used as a display. In this respect, it will be appreciated that the illustrated configuration of the a-Si layer does not cover the entire illumination area of the device. As an example of the utility of such a device, consider a handwriting recognition system in which the a-Si matrix is used to capture optically the handwriting, the neural network is used to analyse the image and finally the device is used to display the result of the analysis. Other applications of the device include its use in a portable facsimile machine and its use in brightness control apparatus.

Various modifications can be made without departing from the scope of the invention.

What is claimed is:

1. A monolithic semiconductor device comprising a substrate, a layer of photoconductive material formed on the substrate, a transparent insulator formed on the photoconductive material and a layer of material which emits light when electrically stimulated, said layer of light emitting material being formed on the transparent insulator.

2. A semiconductor device as claimed in claim 1, wherein the light emitting layer is an organic electro-luminescent material.

3. A semiconductor device as claimed in claim 1, wherein the light emitting layer is a light emitting polymer.

4. A semiconductor device as claimed in claim 1, wherein the area of the photoconductive material is smaller than the area of the light emitting material.

5. A semiconductor device as claimed in claim 4, wherein the substrate is transparent.

6. A semiconductor device as claimed in claim 1, wherein a layer of insulating material is provided between the substrate and the layer of photoconductive material and a transparent electrode is formed between the transparent insulator and the layer of light emitting material.

7. A semiconductor device as claimed in claim 6, wherein the transparent electrode is an ITO.

8. A neural network comprising a plurality of semiconductor devices as claimed in claim 1.

9. A method of manufacturing a monolithic semiconductor device comprising the steps of providing a substrate, forming a layer of photoconductive material on the substrate, forming a transparent insulator on the photoconductive material, and forming on the transparent insulator a layer of material which emits light when electrically stimulated.

10. A method as claimed in claim 9, further comprising the steps of: forming a layer of insulating material on the substrate such that the layer of photoconductive material is subsequently formed on the insulating material; and forming a transparent electrode on the transparent insulator such that the layer of light emitting material is subsequently formed on the transparent electrode.

11. A method as claimed in claim 9, further comprising the steps of: forming an electrode on the layer of light emitting material and subsequently formed on the transparent electrode.

12. A method as claimed in claim 9, wherein the method involves the use of TFT techniques.

13. A method as claimed in claim 12, further comprising the step of also forming one or more TFTs on the substrate, said TFTs being operatively connected to the photoconductive and/or light emitting layer.

14. A semiconductor device as claimed in claim 2, wherein the light emitting layer is a light emitting polymer.

15. A method as claimed in claim 10, further comprising the steps of: forming an electrode on the layer of light emitting material and subsequently formed on the transparent electrode.

16. A method as claimed in claim 10, wherein the method involves the use of TFT techniques.

17. A method as claimed in claim 11, wherein the method involves the use of TFT techniques.

* * * * *